US006407556B1

(12) United States Patent
Rudeke

(10) Patent No.: US 6,407,556 B1
(45) Date of Patent: Jun. 18, 2002

(54) SENSOR FOR INDICATING CHANGES IN THE PRESENCE OF PERSONS OR OBJECTS

(76) Inventor: Jan Rudeke, Herrmans väg 13, S-512 51 Svenljunga (SE)

(*) Notice: Subject to any disclaimer, the term of this patent is extended or adjusted under 35 U.S.C. 154(b) by 0 days.

(21) Appl. No.: 09/380,544

(22) PCT Filed: Feb. 24, 1998

(86) PCT No.: PCT/SE98/00324

§ 371 (c)(1), (2), (4) Date: Nov. 3, 1999

(87) PCT Pub. No.: WO98/39751

PCT Pub. Date: Sep. 11, 1998

(30) Foreign Application Priority Data

Mar. 6, 1997 (SE) .............................................. 9700802

(51) Int. Cl.[7] ................................................ G01R 27/26

(52) U.S. Cl. ....................... 324/663; 324/671; 324/672; 324/674; 324/686; 324/562; 324/687

(58) Field of Search ................................ 324/663, 671, 324/672, 674, 686, 687; 340/562

(56) References Cited

U.S. PATENT DOCUMENTS

| | | | | | |
|---|---|---|---|---|---|
| 4,099,118 | A | * | 7/1978 | Franklin et al. | 324/671 |
| 5,019,804 | A | | 5/1991 | Fraden | 340/562 |
| 5,159,316 | A | | 10/1992 | Lazzara | 340/568 |
| 5,525,843 | A | * | 6/1996 | Howing | 324/663 X |
| 5,724,024 | A | * | 3/1998 | Sonderegger et al. | 340/562 |
| 5,802,479 | A | * | 9/1998 | Kithil et al. | 324/688 X |
| 5,808,552 | A | * | 9/1998 | Wiley et al. | 340/562 |
| 5,938,798 | A | * | 8/1999 | Hanawa et al. | 29/623.1 |
| 6,030,552 | A | * | 2/2000 | Ambros et al. | 252/502 |
| 6,191,593 | B1 | * | 2/2001 | Tartagni et al. | 324/687 |

FOREIGN PATENT DOCUMENTS

| | | |
|---|---|---|
| EP | 0723166 | 7/1996 |
| GB | 2081454 | 2/1982 |

OTHER PUBLICATIONS

Patent Abstracts of Japan, JP–A–43–56529, Dec. 10, 1992.

* cited by examiner

*Primary Examiner*—N. Le
*Assistant Examiner*—Wasseem M. Hamdan

(57) ABSTRACT

A sensor for indicating changes in the physical presence of persons or objects and including at least two electrically conductive sheets of material that are spaced mutually apart on an electrically non-conductive carrier sheet or the like. A sensing circuit is also provided for sensing changes in the capacitance between the electrically conductive sheets.

14 Claims, 1 Drawing Sheet

SENSOR FOR INDICATING CHANGES IN THE PRESENCE OF PERSONS OR OBJECTS

CROSS REFERENCE TO RELATED APPLICATION

This application is the national phase under 35 U.S.C. §371 of prior PCT International application No. PCT/SE98/00324 which has an International filing date of Feb. 24, 1998 which designated the United States of America.

BACKGROUND OF THE INVENTION

1. Field of the Invention

The present invention relates to a proximity-type sensor.

2. Description of the Related Art

There is a great need for sensors, or detectors, that contain no movable parts, that are soft and pliable, and that can be produced in shapes and sizes that suit the field of use for which they are intended. Several different types of proximity sensors for indicating the presence of people or objects are known to the art. Examples of such sensors include different types of membrane contacts, infrared detectors, etc. These known sensors, however, are more or less complicated and in certain cases expensive. There is also a need for an inexpensive and simple contactless sensor that is able to detect, or sense, the presence of a person or an object without coming into contact therewith. It is also desired to be able to produce very thin sensors of this kind.

SUMMARY

The present invention relates to a sensor that can sense the presence of a person or an object either without or by coming into contact with said person or said object, that can be made very thin, that lacks movable parts, and that can be designed to suit the area of use for which it is intended. Accordingly, the present invention provides a sensor for indicating changes in the physical presence of persons or objects, and is characterized in that the sensor includes at least two electrically conductive sheets of material that are spaced mutually apart on an electrically non-conductive carrier sheet or the like; and in that a sensing circuit is provided for sensing changes in the capacitance between electrically conductive sheets.

BRIEF DESCRIPTION OF THE DRAWINGS

The invention will now be described in more detail with reference to exemplifying embodiments of the invention and also with reference to the accompanying drawing, in which.

DETAILED DESCRIPTION OF THE INVENTION

Figure 1:
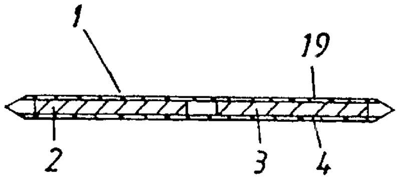
FIGS. 1 and 2 illustrate the principles of a sensor according to a first embodiment.
Figure 2:
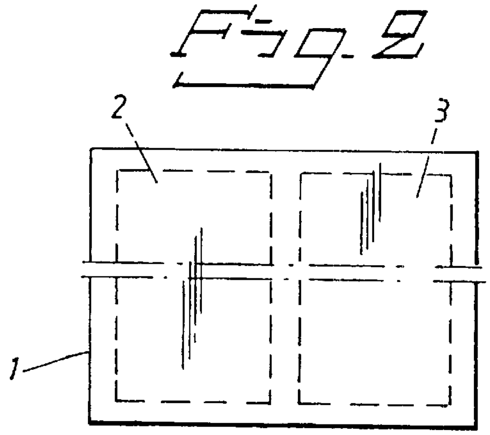

FIG. 1 is a cross-sectional view of a first embodiment of an inventive sensor 1. FIG. 2 shows the sensor of FIG. 1 from above. The sensor is intended to indicate a change in the proximity of persons or objects.

The inventive sensor includes at least two sheets of electrically conductive material 2, 3 mounted in mutually spaced relationship on a carrier plate 4 or like substrate that is not electrically conductive. The sensor also includes a sensing or detecting circuit 5 which is designed to detect changes in capacitance between the sheets of electrically-conductive material 2, 3.

In one highly preferred embodiment of the sensor, the electrically-conductive sheets are comprised of a polymeric material that includes a powdered electrically-conductive substance. This polymeric material will preferably be a carbon-containing material. Such materials are easily bent and can be obtained from Minnesota Mining and Manufacturing, Inc. (3M), U.S.A., among other suppliers. This material has been found to have good electrically conductive properties for the purpose concerned.

In the case of the FIG. 1 embodiment, the sheets 2, 3 are juxtaposed on the carrier plate 4. The sensor may also include a covering 19. The carrier plate and also the covering, when provided, will preferably be comprised of an electrically non-conductive plastic material.

The sensor can be made very thin, for instance given a thickness of about 1 (millimeter (mm). When an object or a person comes into the close proximity of the two sheets 2, 3, or in contact therewith, the capacitance between the sheets 2, 3 will change. For instance, if the capacitance between the sheets 2, 3 is 30 pF when no person or object is in the proximity of the sensor, the capacitance will increase to, e.g., 200 pF when a person's hand comes close to the elements. The change in capacitance is thus a significant change.

Figure 6:
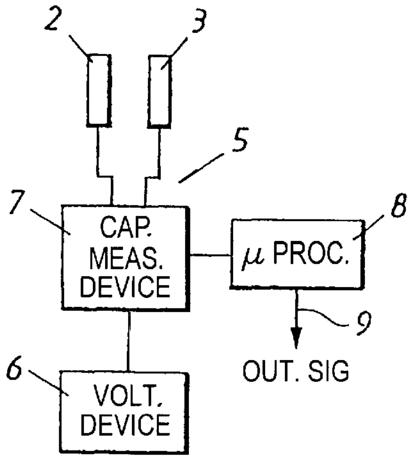
FIG. 6 illustrates an electronic circuit in block diagrammatic form.

FIG. 6 illustrates in block form a sensing circuit which is designed to sense or detect changes in capacitance between the two sheets. The circuit 5 includes a voltage device 6 which functions to apply an electric voltage between the sheets 2, 3, and a suitable kind of capacitance measuring device 7. The circuit also includes a suitable microprocessor 8 for detecting those changes in capacitance that occur. The microprocessor 8 has a signal output 9 via which the processor delivers an electric signal when a certain predetermined change in capacitance occurs. This signal can be used to control some other device, for instance an alarm, an indicator lamp, etc., with which the inventive sensor is used.

This predetermined change in capacitance must, of course, be adapted to the size of the sensor and its anticipated use. For instance, if the sensor is intended to detect the close presence of a person's hand, such as mentioned above, a capacitance change of 50 pF may be suitable as the predetermined capacitance change.

According to one preferred embodiment, the sensing circuit 5 is designed to deliver an electric signal 9 when the capacitance changes to a predetermined value within a predetermined time period. This embodiment prevents slow capacitance changes caused by external circumstances from producing an electric signal. One such circumstance may, for instance, be a change in the relative humidity.

A sensor according to this first embodiment may conveniently be used in beds, such as to indicate when a patient leaves his/her bed and when the patient lies on his/her bed.

Ideally, the sensor will be placed in the center of the bed and transversely to its longitudinal axis. In this case, the sensing circuit may be constructed to deliver a signal solely when the value of the change in capacitance is so high as to correspond to when a patient lays on or leaves his/her bed.

The inventive sensor can also be used as a switch, where the signal from the sensing circuit controls an electric contact means or some other electric circuit. One appropriate use of the sensor in this respect is in the seats of automotive vehicles, e.g. cars and limousines, so as to indicate when a vehicle seat is occupied. The sensor is used to deliver a seat-belt warning signal.

Figure 3:
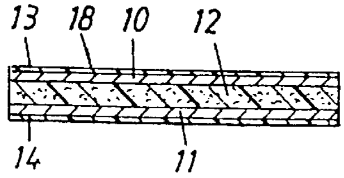
FIGS. 3 and 4 illustrate the principles of a sensor according to a second embodiment.
Figure 4:
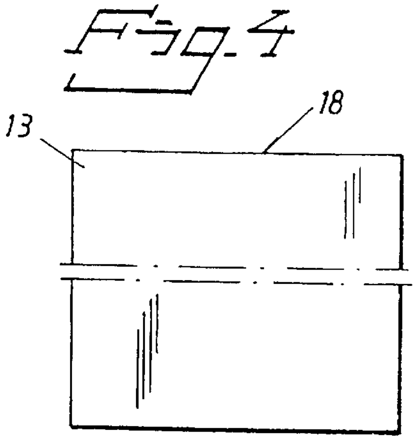

FIGS. 3 and 4 illustrate a second embodiment of the invention, in which the two sheets 10, 11 are placed one above the other. FIG. 3 is a cross-sectional view while FIG. 4 shows the sensor from above. The sheets are mutually separated by an intermediate sheet 12 of electrically conductive compressible material. This material may, for instance, be a plastic foam material. In the case of this embodiment, the intermediate sheet 12 may form said carrier sheet. However, the covering or carrying sheet 13, 14 may be provided on one or both sides of the sensor.

In the case of this second embodiment, capacitance changes will occur between the sheets 10, 11 as a result of changes in the distance between said elements. A sensor constructed in accordance with this embodiment may be placed beneath a carpet or mat on which people walk or stand, such that a significant change in capacitance will occur when a person's foot is placed on the carpet or mat. The elements 10, 11 are coupled to the sensing circuit 5 in the same manner as described with reference to the elements 2, 3.

Figure 5:
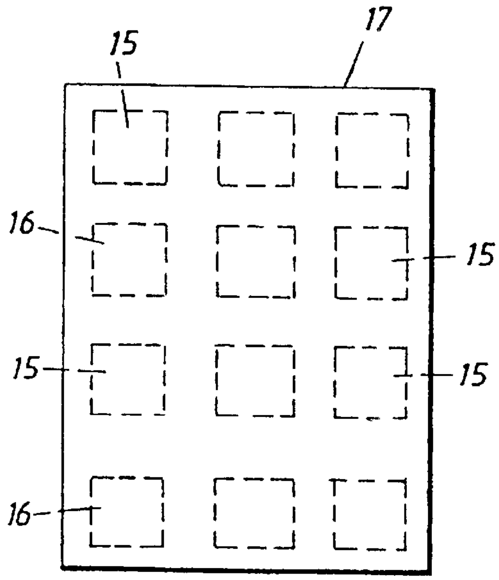
FIG. 5 illustrates an alternative embodiment.

In the case of another embodiment illustrated in FIG. 5, the sensor includes two or more mutually different fields 15 comprised of sheets of electrically conductive material, where the capacitance is measured between mutually adjacent fields or within each field. Each field may either consist in a sensor of the design illustrated in FIGS. 3 and 4, or the capacitance can be measured between pairs of fields 15, 16 in accordance with the embodiment illustrated in FIGS. 1 and 2.

This embodiment thus enables a plurality of mutually different capacitance changes to be measured with one and the same sensor 17. Each field in an embodiment according to FIG. 1 or each pair of fields in an embodiment according to FIG. 3 is herewith connected to the sensing circuit in FIG. 5. When two or more capacitances shall be measured in one and the same sensor, the sensing circuit will preferably be designed to scan respective capacitances in a successive order and therewith detect the occurrence of any capacitance change that may have taken place.

The sensor arrangement shown in FIG. 3 may be designed to indicate a direction, for instance the walking direction of a person. When a sensor according to FIG. 5 is placed under a doormat and the sensor is sufficiently large to be actuated by at least two steps of a person walking on the mat, the sensor arrangement may be adapted to indicate whether a person is entering or leaving a store or shop, for instance.

The fact that the sheets are comprised of a plastic material enables them to be bent or flexed. Because the sensors can be bent or flexed and given any appropriate shape as seen from above, the sensors can be constructed to suit all purposes in the present context.

The sensor may also be used as an anti-pinch device in connection with elevator doors or other automatic doors. The sensor may also be used as part of a burglar alarm system, by placing the sensor beneath or adjacent to valuable objects, such as museum objects.

Quite another area of use of the sensor, and then primarily a sensor according to the first embodiment, is as a liquid leakage monitor or liquid level monitor. A significant change in capacitance is obtained when liquid comes into the close proximity of the two sheets or in contact therewith.

It will be obvious that the sensor can be constructed in a manner different to that shown and described. For instance, the various fields may have shapes other than a square or a rectangular shape.

Furthermore, the carrier plate of the first embodiment can be a rigid plate when application of the sensor so requires. The coverings in the second embodiment can also be made rigid.

The invention shall not therefore be considered to be limited to the aforedescribed and illustrated exemplifying embodiments thereof, since variations and modifications can be made within the scope of the following Claims.

What is claimed is:

1. A sensor for indicating changes in the physical presence of persons or objects comprising:

at least one sensor field including at least two sheets of electrically conductive material spaced mutually apart on a flexible electrically non-conductive plastic carrier sheet, and, a sensing circuit which detects changes in capacitance between the two sheets of electrically conductive material so as to provide an indication of said changes in physical presence, and wherein the electrically conductive sheets are comprised of a polymeric material that includes a pulverized electrically conductive material including carbon.

2. A sensor according to claim 1, wherein the sheets are juxtapositioned on said carrier sheet.

3. A sensor according to claim 1, wherein said at least one sensor field comprises two or more different fields of at least two sheets of electrically conductive material, said capacitance being measured between mutually adjacent sheets of electrically conductive material within each field.

4. A sensor according to claim 1 wherein the sensing circuit is designed to generate an electric signal when the capacitance changes by a predetermined value within a predetermined time period.

5. A sensor for indicating changes in the physical presence of persons or objects comprising:

at least one sensor field including at least two sheets of electrically conductive material spaced mutually apart on flexible electrically non-conductive carrier means, and, a sensor circuit which detects changes in capacitance between the sheets of electrically conductive material so as to provide an indication of said changes in physical presence, and wherein the electrically conductive sheets are comprised of a polymeric material that includes a pulverized electrically conductive material.

6. A sensor for indicating changes in the physical presence of persons or objects comprising:

at least one sensor field including at least two coplanar sheets of electrically conductive material spaced mutually apart on electrically non-conductive carrier means, and, a sensing circuit which detects changes in capacitance between the sheets of electrically conductive material so as to provide an indication of said changes in physical presence, and wherein the electrically conductive sheets are comprised of a polymeric material that includes a pulverized electrically conductive material.

7. A sensor according to claim 6 wherein said non-conductive carrier means comprises a flexible non-conductive carrier sheet.

8. A sensor according to claim 7 wherein said carrier sheet is comprised of plastic.

9. A sensor according to claim 6 and additionally including covering means over said at least two coplanar conductive sheets and the non-conductive carrier means.

10. A sensor according to claim 9, wherein said covering means is comprised of plastic material.

11. A sensor according to claim 7 wherein said at least one sensor field comprises plural sensor fields and said at least two sheets of conductive material comprise plural pairs of coplanar sheets of conductive material.

12. A sensor according to claim 6 wherein said at least two sheets of conductive material comprise multiple pairs of mutually aligned sheets of conductive material.

13. A sensor according to claim 12 wherein said sheets are arranged in rows and columns.

14. A sensor according to claim 6 wherein the pulverized electrically conductive material includes carbon.

* * * * *